(12) United States Patent
Eggers

(10) Patent No.: US 10,274,566 B2
(45) Date of Patent: Apr. 30, 2019

(54) DIXON-TYPE WATER/FAT SEPARATION MRI USING HIGH-SNR IN-PHASE IMAGE AND LOWER-SNR AT LEAST PARTIALLY OUT-OF-PHASE IMAGE

(71) Applicant: KONINKLIJKE PHILIPS N.V., Eindhoven (NL)

(72) Inventor: Holger Eggers, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 651 days.

(21) Appl. No.: 14/781,379

(22) PCT Filed: Mar. 17, 2014

(86) PCT No.: PCT/IB2014/059890
§ 371 (c)(1),
(2) Date: Sep. 30, 2015

(87) PCT Pub. No.: WO2014/162218
PCT Pub. Date: Oct. 9, 2014

(65) Prior Publication Data
US 2016/0033606 A1    Feb. 4, 2016

Related U.S. Application Data

(60) Provisional application No. 61/807,783, filed on Apr. 3, 2013.

(51) Int. Cl.
*G01R 33/56*        (2006.01)
*G01R 33/48*        (2006.01)
(Continued)

(52) U.S. Cl.
CPC ......... *G01R 33/5607* (2013.01); *G01R 33/36* (2013.01); *G01R 33/3852* (2013.01);
(Continued)

(58) Field of Classification Search
CPC ............ G01R 33/4828; G01R 33/5611; G01R 33/5616; G01R 33/385; G01R 33/4824;
(Continued)

(56) References Cited

U.S. PATENT DOCUMENTS 7,518,364 B1    4/2009  Cukur
7,592,810 B2 *  9/2009  Reeder ............... G01R 33/4828
                                                324/307
(Continued)

FOREIGN PATENT DOCUMENTS

JP      62066846 A    3/1987
JP      9238918 A     9/1997

OTHER PUBLICATIONS

Reeder et al "Multicoil Dixon Chemical Species Separation with an Iterative Least-Squares Estimation Method" Magnetic Resonance in Medicine. 51 p. 35-45 (2004).
(Continued)

*Primary Examiner* — Gregory H Curran

(57) ABSTRACT

A method of Dixon-type MR imaging includes the steps of —generating a first imaging sequence for producing first MR echo signals at a first echo time, such that contributions from MR signals emanating from water protons and MR signals emanating from fat protons to the first MR echo signals are essentially in phase, —acquiring the first MR echo signals at a first signal-to-noise ratio, —generating a second imaging sequence for producing second MR echo signals at a second echo time, such that contributions from MR signals emanating from water protons and MR signals emanating from fat protons to the second MR echo signals are at least partially out of phase, —acquiring the second MR echo signals at a second signal-to-noise ratio which is different from the first signal-to-noise ratio, and —reconstructing a MR image from the first and second MR echo
(Continued)

signals. The signal contributions from water protons and fat protons are separated.

17 Claims, 2 Drawing Sheets

(51) Int. Cl.
  *G01R 33/36* (2006.01)
  *G01R 33/385* (2006.01)
  *G01R 33/561* (2006.01)
(52) U.S. Cl.
  CPC ....... *G01R 33/4828* (2013.01); *G01R 33/561* (2013.01); *G01R 33/5617* (2013.01)
(58) Field of Classification Search
  CPC .................. G01R 33/5617; G01R 33/583; G01R 33/243; G01R 33/3664; G01R 33/3852
  See application file for complete search history.

(56) References Cited

U.S. PATENT DOCUMENTS

| | | | | |
|---|---|---|---|---|
| 9,575,153 | B2* | 2/2017 | Simonetti | G01R 33/4828 |
| 2005/0215882 | A1* | 9/2005 | Chenevert | A61B 5/055 |
| | | | | 600/410 |
| 2008/0285833 | A1 | 11/2008 | Fu et al. | |
| 2010/0237865 | A1 | 9/2010 | Stemmer | |
| 2012/0169337 | A1* | 7/2012 | Weng | A61B 5/055 |
| | | | | 324/309 |
| 2013/0249553 | A1* | 9/2013 | Simonetti | G01R 33/4828 |
| | | | | 324/309 |
| 2015/0042334 | A1* | 2/2015 | Kannengiesser | G01R 33/3664 |
| | | | | 324/309 |
| 2016/0124064 | A1* | 5/2016 | de Weerdt | G01R 33/243 |
| | | | | 324/309 |
| 2016/0231405 | A1* | 8/2016 | Eggers | G01R 33/4828 |

OTHER PUBLICATIONS

Eggers et al "Dual Echo Dixon Imaging with Flexible Choice of Echo Times" Magnetic Resonance in Medicine 65 p. 96-107 (2011).
Reeder et al "Homodyne Reconstruction and IDEAL Water-Fat Decomposition" Magnetic Resonance in Medicine 54 p. 586-593 (2005).
Lu et al "Water-Fat Separation with Bipolar Multiecho Sequences" Magnetic Resonance in Medicine 60, p. 198-209 (2008).
Schindera et al "Abdonimal Magnetic Resonance Imaging at 3.0T" Academic Radiology vol. 13, No. 10 Oct. 1, 2006 p. 1236-1243.
Ballweg et al "Optimized in phase and Opposed-phase MR Imaging for Accurate Detection of Small Fat or Water Fractions . . . " Magn. Reson. Mater Phy (2011) vol. 24, p. 167-178.
Glover "Multipoint Dixon Technique for Water and Fat Proton and Susceptibility Imaging" Journal of Magnetic Resonance Imaging, vol. 1. Jan. 1, 1991 p. 521-530.
Buxton et al"Quantitative Proton Chemical Shift Imaging" Magnetic Resonance in Med. vol. 3, p. 881-900 (1986).
Ma et al "Method for Efficient Fast Spin Echo Dixon Imaging" Magnetic Resonance in Med. Vo. 48, p. 1021-1027 (2002).
Xiang Two-Point Water-Fat Imaging with Partially Opposed Phase (POP) Acquisition . . . Magnetic Resonance in Medicine 56 p. 572-584 (2006).
Berglund et al "Two-Point Dixon Method with Flexible Echo Times" Magnetic Resonance in Medicine 65 p. 994-1004 (2011).
Ahmad et al "A Method for Automatic Identification of Water and Fat Images from a Symmetrically Sampled Dual-Echo . . . " Magnetic Resonance Imaging 28 (2010) p. 427-433.

\* cited by examiner a)

b)

DIXON-TYPE WATER/FAT SEPARATION MRI USING HIGH-SNR IN-PHASE IMAGE AND LOWER-SNR AT LEAST PARTIALLY OUT-OF-PHASE IMAGE

CROSS REFERENCE TO RELATED APPLICATIONS

This application is a U.S. national phase application of International Application No. PCT/IB2014/059890, filed on Mar. 17, 2014, which claims the benefit of U.S. provisional Application Ser. No. 61/807,783 filed on Apr. 3, 2013 and is incorporated herein by reference.

FIELD OF THE INVENTION

The invention relates to the field of magnetic resonance (MR) imaging. It concerns a method of MR imaging of a portion of a body placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field $B_0$ extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired with different phase encoding. Each line is digitized by collecting a number of samples. A set of k-space data is converted to an MR image by means of Fourier transformation.

In MR imaging, it is often desired to obtain information about the relative contribution of water and fat to the overall signal, either to suppress the contribution of one of them or to separately or jointly analyze the contribution of all of them. These contributions can be calculated if information from two or more corresponding echoes, acquired at different echo times, is combined. This may be considered as chemical shift encoding, in which an additional dimension, the chemical shift dimension, is defined and encoded by acquiring a couple of images at slightly different echo times. For water-fat separation, these types of experiments are often referred to as Dixon-type of measurements. By means of Dixon imaging or Dixon water/fat imaging, a water-fat separation can be achieved by calculating contributions of water and fat from two or more corresponding echoes, acquired at different echo times. In general such a separation is possible because there is a known precessional frequency difference of hydrogen in fat and water. In its simplest form, water and fat images are generated by either addition or subtraction of the 'in-phase' and 'out-of-phase' datasets.

Several Dixon-type MR imaging methods have been proposed in recent years. Apart from different strategies for the water-fat separation, the known techniques are mainly characterized by the specific number of echoes (or points) they acquire and by the constraints that they impose on the used echo times. Conventional so-called two- and three-point methods require in-phase and opposed-phase echo times at which the water and fat signals are parallel and antiparallel in the complex plane, respectively. Three-point methods have gradually been generalized to allow flexible echo times. Thus, they do not restrict the angle or phase between the water and fat signals at the echo times to certain values anymore. In this way, they provide more freedom in imaging sequence design and enable in particular a trade-off between signal-to-noise ratio (SNR) gains from the acquisition and SNR losses in the separation. Sampling only two instead of three echoes is desirable to reduce scan time. However, constraints on the echo times may actually render dual-echo acquisitions slower than triple-echo acquisitions. Eggers et al. (Magnetic Resonance in Medicine, 65, 96-107, 2011) have proposed a dual-echo flexible Dixon-type MR imaging method which enables the elimination of such constraints. Using such Dixon-type MR imaging methods with more flexible echo times, in-phase and opposed-phase images are no longer necessarily acquired, but optionally synthesized from water and fat images.

However, the in-phase and out-of-phase images acquired (or synthesized) in the afore-described Dixon-type MR imaging methods suffer from a poor SNR as compared to the water and fat images obtained with these methods. This is due to an averaging effect commonly quantified by the effective number of signal averages (NSA) from which the water and fat images resulting from the Dixon water-fat separation usually benefit, but not acquired in-phase and out-of-phase images, and not or only to a lesser extent synthesized in-phase and out-of-phase images. Moreover, the in-phase images acquired (or synthesized) in the afore-described Dixon-type MR imaging methods suffer from a poor SNR as compared to in-phase images acquired by means of separate, tailored, non-Dixon-type MR imaging methods. A comparable SNR would often only be achievable in prohibitively long scan times.

From the foregoing it is readily appreciated that there is a need for an improved technique for Dixon-type MR imaging. It is consequently an object of the invention to provide a method that enables Dixon water-fat separation with high SNR in particular in the acquired (or synthesized) in-phase images.

SUMMARY OF THE INVENTION

In accordance with the invention, a method of MR imaging of an object placed in an examination volume of a MR device is disclosed. The method comprises the following steps:
  subjecting the object to a first imaging sequence which generates first MR echo signals at a first echo time, such that contributions from MR signals emanating from water protons and MR signals emanating from fat protons to the first MR echo signals are essentially in phase,
  acquiring the first MR echo signals at a first signal-to-noise ratio,
  subjecting the object to a second imaging sequence which generates second MR echo signals at a second echo time, such that contributions from MR signals emanating from water protons and MR signals emanating from fat protons to the second MR echo signals are at least partially out of phase,
  acquiring the second MR echo signals at a second signal-to-noise ratio which is smaller than the first signal-to-noise ration, and
  reconstructing a MR image from the first and second MR echo signals, wherein signal contributions from water protons and fat protons are separated.

It is the gist of the invention to acquire the in-phase signals and the (partially) out-of-phase signals with unequal SNR.

In a preferred embodiment of the invention, two separate, but interleaved fast or turbo spin-echo imaging sequences, the first and second imaging sequences, are used to acquire the in-phase (first MR signals) and the (partially) out-of-phase signals (second MR signals). Under the same timing constraints on these turbo spin-echo imaging sequences, it turns out that the in-phase signals can be acquired with lower readout magnetic resonance gradient strength and lower signal receiving bandwidth and thus with higher SNR than the (partially) out-of-phase signals. Moreover, it can be shown that the (fat-suppressed) water images reconstructed from the in-phase and (partially) out-of-phase signals also benefit from the higher SNR in the acquired in-phase signals. In this way, the invention achieves a higher SNR in the acquired in-phase images and in the calculated water (or fat-suppressed) images in the same scan time, or a comparable SNR in a shorter scan time. In addition, it allows tailoring the SNR in the in-phase and water (or fat-suppressed) images individually as required, by adapting the SNR of the in-phase signals acquisition relative to the SNR of the (partially) out-of-phase signals acquisition.

Alternatively, the in-phase signals and the (partially) out-of-phase signals can be acquired with a single dual-echo sequence, in which the readout magnetic resonance gradient strength and the signal receiving bandwidth are individually adapted for each of the two echoes. Moreover, more than two MR echo signals can be acquired either way with individually adapted readout magnetic resonance gradient strength and signal receiving bandwidth i.e. with unequal SNR.

More specifically, in the afore-described preferred embodiment, the first MR echo signals are acquired using a readout magnetic field gradient having a first gradient strength, and the second MR echo signals are acquired using a readout magnetic field gradient having a second gradient strength which is larger than the first gradient strength. Simultaneously, the first MR echo signals are acquired using a signal receiving bandwidth which is smaller than the signal receiving bandwidth used for the acquisition of the second MR echo signals. In other words, the whole acquisition is split up into two, usually interleaved sub-acquisitions, performed with a low-bandwidth sub-sequence (the first imaging sequence) and a high-bandwidth sub-sequence (the second imaging sequence), respectively. In the low-bandwidth sub-sequence, a high signal sampling efficiency is reached by sampling the first MR echo signals during most of the interspacing between the refocusing RF pulses. This low-bandwidth and high sampling efficiency yields a high SNR. The low-bandwidth first imaging sequence has a fixed first echo time, at which water and fat signals are in phase. The high-bandwidth second imaging sequence has an adjustable second echo time, at which water and fat signals are at least partially out of phase. The second imaging sequence achieves only a lower sampling efficiency and provides a lower SNR, since it has to cover the same gradient integral in less time to obtain the echo shift required for subsequent Dixon water-fat separation based on both sub-sequences.

According to a further preferred embodiment of the invention, each of the first and second imaging sequences are repeated for signal accumulation, wherein the number of repetitions of the first imaging sequence is different from the number of repetitions of the second imaging sequence. Selectively repeating the first and second imaging sequences respectively can be used in order to tailor the SNR in the in-phase, water, and fat images individually, including improving it in the in-phase images and equalizing it in the in-phase and water images. Simultaneously, the overall scan time can be kept within acceptable limits.

According to the invention, more than the first and second MR echo signals (i.e. third, fourth etc. MR echo signals) may be acquired at third (fourth etc.) echo times with a third (fourth etc.) SNR respectively. The first, second, third (fourth etc.) MR echo signals may be generated by separate imaging sequences or by a single multi-echo imaging sequence, for example a spin-echo, gradient-echo or hybrid imaging sequence, of which the first and second (third, fourth etc.) imaging sequences constitute sub-sequences.

The method of the invention described thus far can be carried out by means of a MR device including at least one main magnet coil for generating an essentially uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
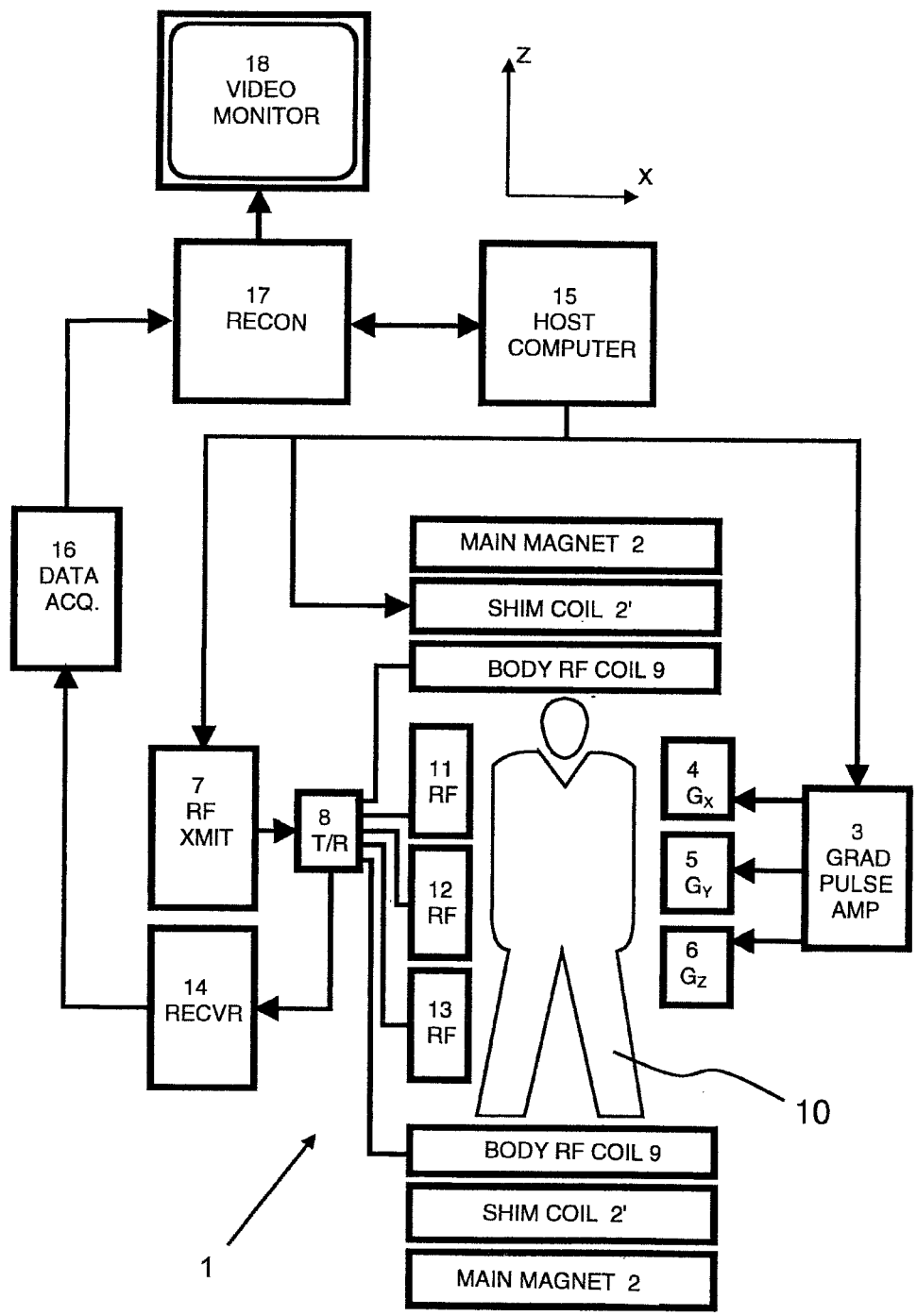
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field $B_0$ is created along a z-axis through an examination shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the shimming coils 2' as well as the gradient pulse amplifier 3 and the transmitter 7 to generate the imaging sequences of the invention. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

As explained above, separate imaging sequences are employed according to the invention, referred to as first and second imaging sequences, to acquire in-phase (first MR signals) and (partially) out-of-phase signals (second MR signals) from water and fat protons.

FIG. 2a shows a pulse sequence diagram of a turbo spin echo (TSE) sequence constituting a first imaging sequence of the method according to the invention. The depicted sequence is optimized to provide in-phase MR signals from water and fat protons with high SNR. The diagram shows switched magnetic field gradients in the frequency-encoding direction (M), the phase-encoding direction (P) and the slice-selection direction (S). Moreover, the diagram shows the RF excitation and refocusing pulses as well as the time intervals during which first MR echo signals are acquired, designated by ACQ1. To yield in-phase images with high SNR by the sequence shown in FIG. 2a, a comparatively weak readout gradient (in the M-direction) and a low signal receiving bandwidth are chosen. A high sampling efficiency is reached in the first imaging sequence by sampling the MR signals during most of the interspacing between the refocusing pulses.

FIG. 2b shows a schematic pulse sequence diagram for the second imaging sequence within the meaning of the invention. The second imaging sequence is also a TSE sequence with echo shifting to obtain (partially) out-of-phase signals. The signal acquisition periods are indicated by ACQ2 in FIG. 2b. In the depicted example, the spacing between the MR echo signals is kept constant, while the readout gradient strength as well as the receiving signal bandwidth are doubled with respect to the first imaging sequence to enable echo shifting. If the readout gradient strength and the signal receiving bandwidth were kept constant instead, the spacing between the MR echo signals would have to be increased, resulting in an increased scan time.

In conventional Dixon-type MR imaging methods, the same readout gradient strength and the same signal receiving bandwidth as shown in FIG. 2b is also used to collect in-phase MR signals from water and fat protons. The readout gradient and the MR signal echo acquisition are only centered between the RF refocusing pulses for this purpose, introducing substantial dead times in the data acquisition.

Figure 2:
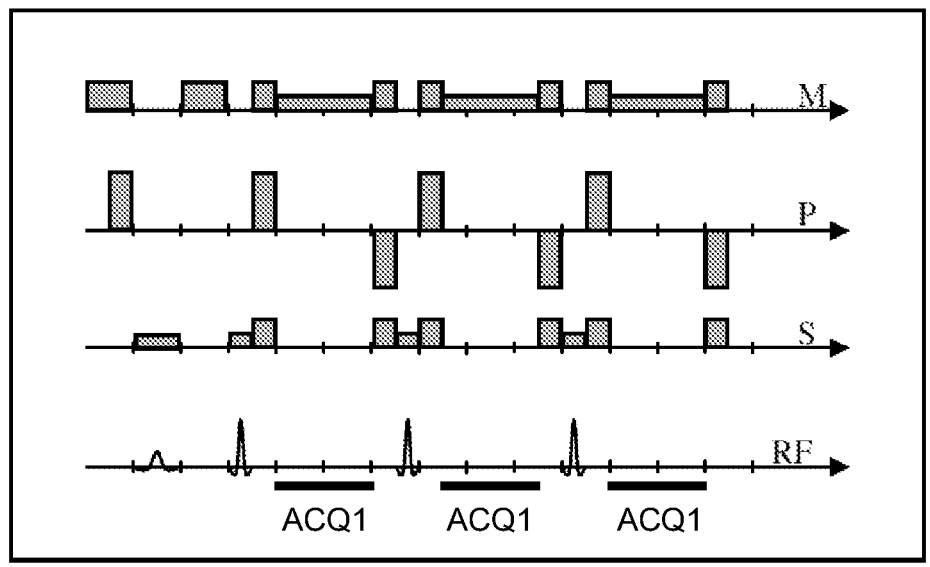
FIG. 2 shows time diagrams illustrating the signal acquisition scheme of the invention.
Figure 2:
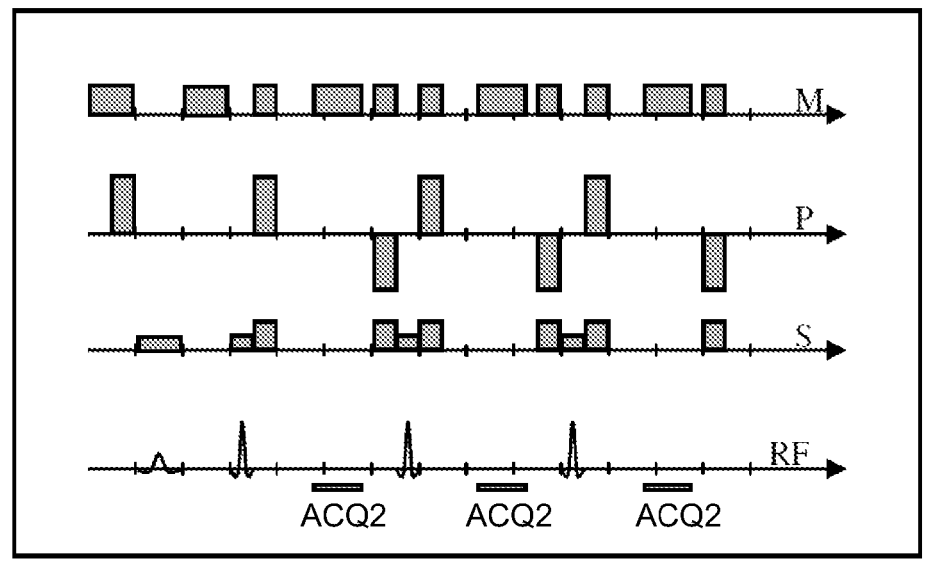

The essential aspect of the acquisition scheme illustrated in FIG. 2 is that it comprises the acquisition of in-phase signals by the first imaging sequence (FIG. 2a) with high SNR, high scan efficiency, and optionally multiple averages, and the acquisition of (partially) out-of-phase signals by the second imaging sequence (FIG. 2b) with lower SNR, lower scan efficiency, and optionally fewer averages. The in-phase and (partially) out-of-phase signal acquisitions are deliberately designed to provide single-echo composite MR images with unequal SNR.

In the reconstruction step of the method of the invention, in-phase images, out-of-phase images, (fat-suppressed) water images and/or fat images may be obtained from the acquired in-phase and (partially) out-of-phase signals by per se known reconstruction algorithms. The calculated (fat-suppressed) water and fat images also benefit from the significantly higher SNR in the acquired in-phase images, which can be shown by a corresponding noise propagation analysis.

In conventional Dixon-type MR imaging methods, the use of the same readout gradient strength and the same receiving bandwidth for the acquisition of both in-phase and (partially) out-of-phase signals has the advantage of providing data with identical fat shift. However, if the difference in fat shift between the acquisitions of the first and second MR signals using the method of the invention is not negligible, dedicated extensions to the water-fat separation may be applied in the reconstruction step to account and correct for this difference (see, for example, Lu et al., Magnetic Resonance in Medicine, 60, 198-209, 2008). Moreover, if the echo shift realizable with a fixed spacing between the RF refocusing pulses in the second imaging sequence are insufficient, partial echo sampling may be applied in this second imaging sequence, combined with again dedicated extensions to the water-fat separation (see, for example, Reeder et al., Magnetic Resonance in Medicine, 54, 486-593, 2005).

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A method of magnetic resonance (MR) imaging of an object placed in an examination volume of a MR device, the method comprising:
    subjecting the object to a first imaging sequence that generates first MR echo signals at a first echo time, such that contributions from MR signals emanating from water protons and MR signals emanating from fat protons to the first MR echo signals are essentially in phase,
    acquiring the first MR echo signals at a first signal-to-noise ratio,
    subjecting the object to a second imaging sequence that generates second MR echo signals at a second echo time, such that contributions from MR signals emanating from water protons and MR signals emanating from fat protons to the second MR echo signals are at least partially out of phase,
    acquiring the second MR echo signals at a second signal-to-noise ratio that is different from the first signal-to-noise ratio, wherein the first MR echo signals are acquired with a plurality of: (i) a lower readout magnetic field gradient strength, (ii) a lower signal receiving bandwidth and (iii) a higher number of repetitions than the second MR echo signals to selectively enhance the SNR of the first MR echo signals, and
    reconstructing a MR image from the first and second MR echo signals, whereby signal contributions from water protons and fat protons are separated.

2. The method of claim 1, wherein the first and second imaging sequences are fast or turbo spin echo sequences, each of the first and second imaging sequences comprising one RF excitation pulse for exciting magnetic resonance within the object and two or more refocusing RF pulses for refocusing magnetic resonance.

3. The method of claim 1, wherein the readout magnetic field gradient strength, the signal receiving bandwidth, and/or the number of repetitions for the acquisitions of the first and second MR echo signals are chosen such that the signal-to-noise ratio of the reconstructed in-phase and water MR images are equal.

4. The method of claim 1, wherein the difference in fat shift between the first and second MR echo signal acquisitions is corrected for in the separation of signal contributions from water protons and fat protons.

5. The method of claim 1, wherein the first MR echo signals are acquired with a lower readout magnetic field gradient strength than the second MR echo signals.

6. The method of claim 1, wherein the first MR echo signals are acquired with a lower signal receiving bandwidth than the second MR echo signals.

7. The method of claim 1, wherein the first MR signals are acquired with a higher number of repetitions than the second MR echo signals.

8. A magnetic resonance (MR) device comprising:
    at least one main magnet coil for generating a uniform, steady magnetic field (B0) within an examination volume,
    one or more gradient coils for generating switched magnetic field gradients in different spatial directions within the examination volume, at least one RF coil for generating RF pulses within the examination volume and/or for receiving MR signals from an object positioned in the examination volume,
    a control unit for controlling the temporal succession of RF pulses and switched magnetic field gradients, and a reconstruction unit for reconstructing MR images from the received MR signals, wherein the MR device is arranged to perform the following steps:
    subjecting the object to a first imaging sequence that generates first MR echo signals at a first echo time, such that contributions from MR signals emanating from water protons and MR signals emanating from fat protons to the first MR echo signals are essentially in phase,
    acquiring the first MR echo signals,
    subjecting the object to a second imaging sequence that generates second MR echo signals at a second echo time, such that contributions from MR signals emanating from water protons and MR signals emanating from fat protons to the second MR echo signals are at least partially out of phase,
    acquiring the second MR echo signals, wherein the first MR echo signals are acquired with a lower readout magnetic field gradient strength, and a higher number of repetitions than the second MR echo signals, and reconstructing a MR image from the first and second MR echo signals, wherein signal contributions from water protons and fat protons are separated.

9. The MR device of claim 8, wherein the first MR echo signals are acquired at a lower readout magnetic field gradient strength than the second MR echo signals.

10. The MR device of claim 8, wherein the first MR echo signals are acquired with a lower signal receiving bandwidth than the second MR echo signals.

11. The MR device of claim 8, wherein the first MR echo signals are acquired with a higher number of repetitions than the second MR echo signals.

12. The MR device of claim 8, wherein the first MR echo signals are acquired with an enhanced signal to noise ratio relative to the second MR echo signals.

13. The MR device of claim 8, wherein the first and second MR echo signals are reconstructed into a water dominant image and a fat dominant image.

14. A computer program comprising executable instructions stored on a non-transitory computer readable storage medium, which when executed by a magnetic resonance (MR) device, causes the MR device to perform a method of MR imaging comprising:

generating a first imaging sequence producing first MR echo signals at a first echo time, such that contributions from MR signals emanating from water protons and MR signals emanating from fat protons to the first MR echo signals are essentially in phase, acquiring the first MR echo signals at a first signal-to-noise ratio, generating a second imaging sequence producing second MR echo signals at a second echo time, such that contributions from MR signals emanating from water protons and MR signals emanating from fat protons to the second MR echo signals are at least partially out of phase, acquiring the second MR echo signals at a second signal-to-noise ratio that is different from the first signal-to-noise ratio, wherein the first MR echo signals are acquired with a plurality of: (i) a lower readout magnetic field gradient strength, (ii) a lower signal receiving bandwidth and (iii) a higher number of repetitions than the second MR echo signals to selectively enhance the SNR of the first MR echo signals, and reconstructing a MR image from the first and second MR echo signals, wherein signal contributions from water protons and fat protons are separated.

15. The computer program of claim 14, wherein the first MR echo signals are acquired with a lower readout magnetic field gradient strength than the second MR echo signals.

16. The computer program of claim 14, wherein the first MR echo signals are acquired with a lower signal receiving bandwidth than the second MR echo signals.

17. The computer program of claim 14, wherein the first MR signals are acquired with a higher number of repetitions than the second MR echo signals.

* * * * *